United States Patent
Champagne

[19]

[11] Patent Number: 6,075,282
[45] Date of Patent: Jun. 13, 2000

[54] LEADFRAME FOR A SEMICONDUCTOR DEVICE AND ASSOCIATED METHOD

[75] Inventor: Michel Champagne, Eybens, France

[73] Assignee: SGS-Thomson Microelectronics S.A., Gentilly, France

[21] Appl. No.: 09/076,257

[22] Filed: May 12, 1998

[30] Foreign Application Priority Data

Jun. 2, 1997 [FR] France ................................. 97 06748

[51] Int. Cl.⁷ .......................... H01L 23/48; H01L 23/02; H01L 23/455
[52] U.S. Cl. .......................... 257/675; 257/712; 257/680; 257/774; 257/666; 257/690; 257/713; 257/707
[58] Field of Search ..................................... 257/690, 675, 257/712, 713, 666, 668, 680, 774, 676, 673, 707

[56] References Cited

U.S. PATENT DOCUMENTS

| | | | |
|---|---|---|---|
| 4,862,246 | 8/1989 | Masuda et al. | 357/70 |
| 5,200,809 | 4/1993 | Kwon | 257/707 |
| 5,225,710 | 7/1993 | Westerkamp | 257/713 |
| 5,291,060 | 3/1994 | Shimizu et al. | 257/667 |
| 5,345,106 | 9/1994 | Doering et al. | 257/675 |
| 5,378,924 | 1/1995 | Liang | 257/675 |
| 5,381,042 | 1/1995 | Lerner et al. | 257/712 |
| 5,397,917 | 3/1995 | Ommen et al. | 257/712 |
| 5,430,250 | 7/1995 | Kwon | 257/676 |
| 5,430,331 | 7/1995 | Hamzehdoost et al. | 257/796 |
| 5,442,234 | 8/1995 | Liang | 257/675 |
| 5,489,805 | 2/1996 | Hackitt et al. | 257/796 |
| 5,576,577 | 11/1996 | Takenouchi et al. | 257/672 |
| 5,641,987 | 6/1997 | Lee | 257/675 |
| 5,683,944 | 11/1997 | Joiner et al. | 257/676 |
| 5,783,860 | 7/1998 | Jeng et al. | 257/675 |
| 5,838,064 | 11/1998 | Shimada et al. | 257/718 |
| 5,859,477 | 1/1999 | Fehr | 257/796 |
| 5,869,883 | 2/1999 | Mehringer et al. | 257/667 |
| 5,872,395 | 2/1999 | Fujimoto | 257/675 |
| 5,874,773 | 2/1999 | Terada et al. | 257/676 |
| 5,920,119 | 7/1999 | Tamba et al. | 257/712 |
| 5,929,514 | 7/1999 | Yalamanchili | 257/676 |

FOREIGN PATENT DOCUMENTS 2-18956  1/1990  Japan ..................................... 257/669

OTHER PUBLICATIONS

Patent Abstracts of Japan, vol. 017, No. 484 (E–1426), Sep. 2, 1993 (JP 05121632).
Patent Abstracts of Japan, vol. 017, No. 538 (E–1440), Sep. 28, 1993 (JP 05152488).
Patent Abstracts of Japan, vol. 016, No. 215 (E–1204), May 20, 1992 (JP 04037050).
Patent Abstracts of Japan, vol. 017, No. 702 (E–1482), Dec. 21, 1993 (JP 05243474).
Patent Abstracts of Japan, vol. 011, No. 325 (E–551), Oct. 22, 1987 (JP 62112356).
Patent Abstracts of Japan, vol. 007, No. 258 (E–211), Nov. 17, 1983 (JP 58143558).

*Primary Examiner*—Alexander O. Williams
*Attorney, Agent, or Firm*—Theodore E. Galanthay; Allen, Dyer, Doppelt, Milbrath & Gilchrist, P.A.

[57] ABSTRACT

The semiconductor device includes, inside a package, a leadframe having a central plate for housing a chip forming an integrated circuit, and a plurality of connection leads placed around the central plate and projecting outside the package. Internal connection wires are also included and which have, in the case of some of them, an end bonded to the central plate. The central plate has several through-passages made in a peripheral region of the central plate. Each of these through-passages lies approximately in the extension of a connection lead. The ends of the earth or ground wires bonded to the central plate lie near at least some of these through-passages.

27 Claims, 4 Drawing Sheets

LEADFRAME FOR A SEMICONDUCTOR DEVICE AND ASSOCIATED METHOD

FIELD OF THE INVENTION

The invention relates to semiconductor devices encapsulated in an encapsulating resin or package, and, more particularly, to their leadframes and to the connection of the internal earth or ground wires.

BACKGROUND OF THE INVENTION

A semiconductor device may comprise a leadframe which includes a central plate for receiving a chip forming an integrated circuit, and a plurality of connection leads placed around the central plate. Internal connection wires are also provided which connect, in the case of some of them, pads on the active face of the chip directly to some of the connection leads. Certain other wires connect pads on the active face of the chip to the central plate of the leadframe, and/or connect the central plate of the leadframe to some of the connection leads of this same leadframe. All these components are encapsulated by molding them in a resin to form a package.

The molding of the encapsulating package around the leadframe and the chip is performed at a temperature of about 185° C. The package is then cooled down to room temperature. However, during these operations, given the difference between the expansion coefficient of the resin and the expansion coefficient of copper, of which the leadframe is in particular composed, there is a risk of defects appearing. The defects may, in particular, result in crazing, cracks or even severance to the point where the ground wires are bonded to the central plate of the leadframe. Such may consequently cause electrical malfunction of the package.

SUMMARY OF THE INVENTION

The invention aims to overcome the above-noted problems, and, most particularly, in the case of small, or even very small packages, for example, square packages the length of one side of which is less than or equal to 10 mm, or even less than or equal to 7 mm.

An object of the invention is also to minimize both the risk of defects appearing at the point where the earth or ground wires are bonded, and to reduce the risk of delamination, i.e. a loss of adhesion between the resin and the leadframe.

Another object of the invention is to provide these advantages for any type of semiconductor device, and, in particular, for a power device requiring the presence of a heat sink within the package.

The invention therefore provides a semiconductor device comprising inside an encapsulating package, a leadframe having a central plate for housing a chip forming an integrated circuit, and a plurality of connection leads placed around the central plate and projecting outside the package. The device further comprises internal connection wires which have, in the case of some of them, generally the earth or ground wires, an end bonded to the central plate.

According to a general characteristic of the invention, the central plate has several through-passages made in a peripheral region of the central plate, each of these through-passages lying approximately in the extension of a connection lead. The ends of the connection wires bonded to the central plate lie near at least some of these through-passages.

The regions lying near these through-passages have a degree of flexibility for the purpose of minimizing the thermal expansion effects during the resin-molding operation. As a consequence, bonding the earth wires near these through-passages, i.e. to flexible regions, makes it possible to minimize the risk of cracks appearing within the bonded joints. Furthermore, the presence of such through-passages allows the encapsulating resin to infiltrate into them, while encapsulating the connection wires, thereby increasing the fastening between the resin and the leadframe, and thus minimizing the risk of delamination.

Moreover, placing the through-passages in the extension of the connection leads makes it possible to provide regions for bonding the earth wires between the extensions of the connection leads, and to provide the possibility of some of the connection wires connecting the pads on the chip directly to the connection leads and to overlap, at least partially, these through-passages. Overlap between these connection wires and the earth wires is, to a large extent, thus avoided, thereby making it possible to optimize the connection layout, to simplify the wire-bonding program and to minimize the risk of a short circuit between two wires. This is so, in particular, for devices in which the central plate of the leadframe is not below the plane containing the connection leads.

It is preferable for the ends of the connection wires bonded to the central plate to lie approximately between the through-passages. This is because there is greater flexibility between the through-passages.

In one variant of the invention, the through-passages are bounded all around their perimeter. In practice, they may consist of circular holes drilled in the central plate of the leadframe. In such a variant in particular, when the chip is fixed to the central plate of the leadframe and when the device furthermore comprises a heat sink fixed to the opposite face of the central plate from that housing the chip, it is advantageous for the peripheral region of the central plate containing the through-passages to extend beyond the outer boundary of the heat sink. Thus, the heat sink does not block off the lower opening of the holes. This could cause, during molding of the resin, a pocket of air to be created inside these holes which would prevent the resin from filling them properly.

In another variant of the invention, the through-passages emerge laterally around the periphery of the central plate. In other words, these through-passages may consist of cut-outs which pass right through the central plate and are open laterally facing the connection leads. Such a variant is particularly well suited for very small packages, for example, square packages the length of one side of which is less than or equal to 7 mm.

In one or both of these variants, when the chip is adhesively bonded to the central plate of the leadframe, the peripheral region of the central plate containing the through-passages is advantageously spaced away from the perimeter of the chip by at least a predetermined distance. This distance is chosen so that the peripheral region is free of adhesive. Typically, a spacing of at least 300 microns will thus be chosen.

To produce very small packages further requiring the presence of a heat sink, provision is advantageously made for the central plate of the leadframe to be annular and to have a central orifice, and with the through-passages emerging around the periphery of the annular central plate. The heat sink therefore supports the peripheral ring of the central plate and the chip is housed in the central orifice of the central plate and is fixed to the heat sink. The outer boundary of the heat sink therefore advantageously extends right up to the edge of the peripheral ring of the central plate so as to support those regions of the ring which lie between the through-passages.

In such an embodiment, the chip is fixed directly to the heat sink, so as to ensure better heat exchange, and the earth or ground wires are bonded to the peripheral ring of the leadframe. This peripheral ring is fixed to the periphery of the heat sink. As a result, the presence of the body of the heat sink under the earth-wire bonding regions, i.e. the regions extending between the through-passages, makes it possible to produce a mechanical bearing surface for these regions. This makes it easier to carry out the operation of bonding of the earth wires to the latter.

The connection leads of the leadframe advantageously have cut-outs in their portions lying inside the package. These thus promote good fastening of the resin to these leads and thus help in further minimizing the risk of delamination, in particular, when bending the external parts of the connection leads projecting outside the package. To minimize the deposition of silver on the copper of the leadframe, this deposition of silver being used for bonding the connection wires but increasing the risk of delamination between the resin and the leadframe, it is particularly advantageous for the leadframe to have only a peripheral annular deposition of silver covering the peripheral region of the plate containing the through-passages, as well as part of the connection leads.

The leadframe includes extensions or "straps" which extend from the corners of the central plate between groups of connection leads. Provision may advantageously be made for other through-passages to be also made in these extensions or near the latter so as to allow optional bonding of connection leads near these other through-passages.

The invention is also directed to a method of connecting the internal earth wires of a semiconductor device comprising a leadframe having a central plate for housing a chip forming an integrated circuit and a plurality of connection leads placed around the central plate. According to this method, through-passages are made in a peripheral region of the central plate, each of these passages lying approximately in the extension of a connection lead of the leadframe, and one end of these earth wires is bonded near at least some of these through-passages. The risk of defects appearing, in particular cracks or crazing, at the point where the said internal earth wires are bonded to the central plate, is thus minimized.

BRIEF DESCRIPTION OF THE DRAWINGS

Other advantages and characteristics of the invention will appear on examining the detailed description of entirely non-limiting embodiments and methods of implementation, and of the appended drawings in which.

DETAILED DESCRIPTION OF THE PREFERRED EMBODIMENTS

Figure 1:
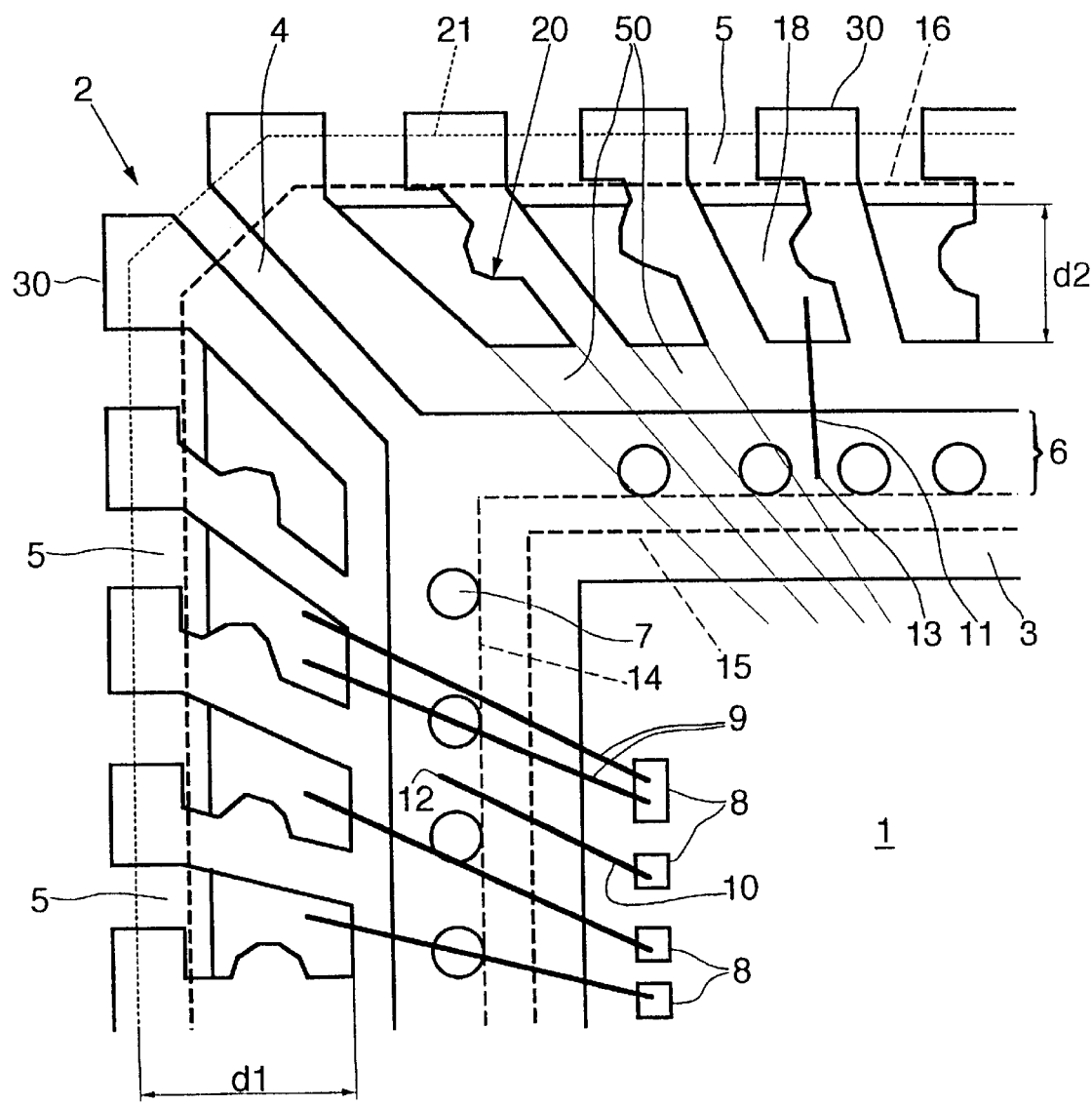
FIG. 1 illustrates, highly diagrammatically, part of a device according to the invention.
Figure 2:
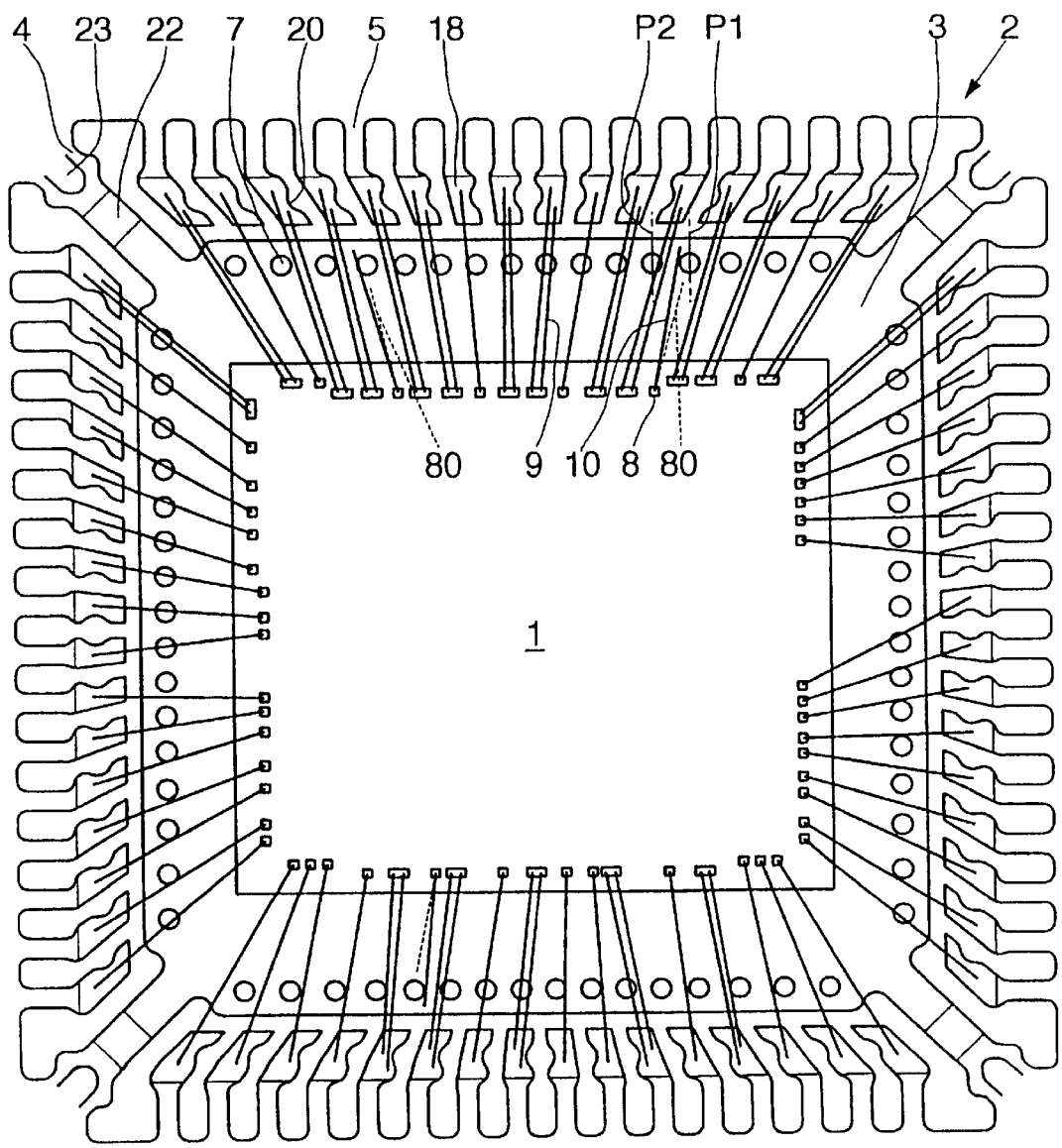
FIG. 2 illustrates, in particular more completely, a leadframe of a device according to the invention of the type shown in FIG. 1.

In FIGS. 1 and 2, the reference 1 denotes a chip forming an integrated circuit having contact pads 8 on its active face.

Another component of the semiconductor device includes a leadframe 2 having, in particular, a central plate 3, or platform, to which the passive face of the chip 1 is fixed, for example, by adhesive bonding. This leadframe is cut from a metal plate and the central plate 3 is held by means of extensions or "straps" extending from its corners. Connection leads 5 placed all around the central plate 3 are cut out between these straps 4.

Figure 4:
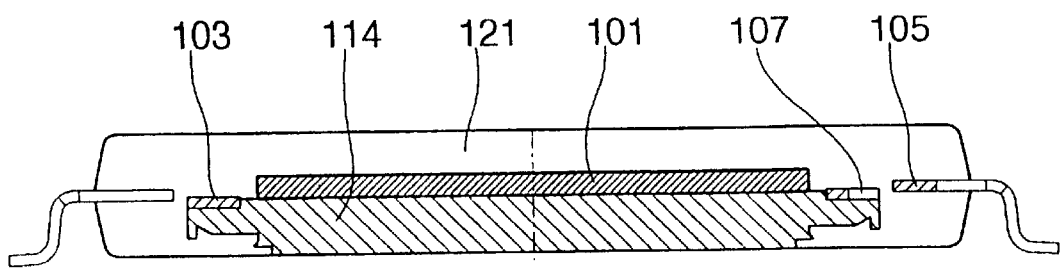

For the sake of simplification, these figures essentially show the parts of the connection leads 5 which lie within the resin encapsulation or package 21, the perimeter of which has been shown diagrammatically by the dashed lines. The connection leads 5 have parts projecting outside the package, and these will subsequently be bent (as illustrated in FIG. 4) to allow the package to be fixed to an electronic board. Before molding the resin 21, the connection leads 5 of the leadframe are mutually connected by linkage parts 30 which will be cut off after molding and curing of the package.

Provided within a peripheral region 6 of the central plate 3 are through-passages 7. These through-passages are, here, holes typically having a diameter of 200 microns, drilled right through the central plate 3 of the leadframe. These holes 7 lie respectively in the extension of the connection leads 5 and, more specifically, in the extension 50 of those parts of these connection leads which lie inside the package 21.

The holes 7 define, near them, and, in particular, between them, regions having a degree of flexibility to which the internal earth or ground wires of the package, such as, for example, the wires 10 connecting the pads 8 to the plate 3 or else the wires 11 connecting the central plate 3 to the connection leads 5, are bonded (by ball bonding or bevel bonding). In a general way, the ends 12, 13 of these earth wires are bonded near these through-passages 7 so as to benefit from the maximum flexibility of the region in question to minimize as much as possible the risk of crazing or cracks appearing while the molding resin is cooling.

When the holes are drilled from above the central plate, this results in a slight surface planarity defect in the immediate vicinity of the hole. Consequently, the end of the earth wires will preferably be bonded at least 80 to 100 $\mu$m from the edge of the holes. Thus, for holes spaced apart by approximately 160 to 200 $\mu$m (which is generally the case for small or very small packages), the earth wires will preferably be bonded half way between the holes. This planarity defect is not on the upper face of the plate when the drilling is performed from below. In this case, it is conceivable to bond the earth wires as close as possible to the holes.

Moreover, although it is preferable to bond the earth wires approximately between two through-passages, i.e., in fact more generally in a region lying between two vertical diametrical planes P1 and P2 of these holes (FIG. 2), these planes being perpendicular to the adjacent edge of the central plate 3, this does not exclude some of the earth wires, such as, for example, the wires referenced 80 in FIG. 2, being able to have their bonded end near a hole, between the hole and the edge of the chip or between the hole and the edge of the plate 3.

Generally, as illustrated in particular in FIG. 2, a through-passage 7 is provided approximately in the extension of each connection lead, even if only some of the corresponding flexible regions are used for bonding the earth wires. This allows the same leadframe to be used for chips having a different connection layout and/or different sizes.

By placing these through-passages approximately in the extension of the connection leads advantageously allows the volume encompassing the area of the hole, which is free of material and therefore cannot be used for bonding an earth wire, to be used in order to take some of the internal connection wires of the package so that they connect the pads 8 on the chip directly to some of the connection leads, such as for example the wires referenced 9 in FIGS. 1 and 2. The connection layout for chips of different sizes is thus optimized and this avoids, in particular, making such connection wires 9 overlap with earth wires.

Making through-passages 7 in the central plate of the leadframe makes it possible to provide, as just mentioned, flexible regions for bonding the earth wires, while at the same time keeping a distance d1 for that part of the connection lead lying inside the package. This is sufficient (typically, about 0.9 mm) to ensure good retention of the lead in the resin, especially during bending. This is particularly advantageous in the case of small packages.

When the chip 1 is fixed to the central platform 3 of the leadframe, for example, by pressing and adhesive bonding, the adhesive used can flow outside the boundary of the chip 1. The peripheral region 6 in which the holes 7 are made must, therefore, lie some predetermined distance from the perimeter of the chip 1 so that this peripheral region 6 is free of adhesive. A spacing of at least 300 microns will advantageously be chosen.

Moreover, when, in particular for power packages, it is necessary to provide a heat sink under the central plate of the leadframe, it is preferable for the boundary 14 of the heat sink not to encroach on the peripheral region 6 so as not to obstruct, even partially, the holes 7. The risk of the holes 7 being poorly filled with the encapsulating resin, caused by the formation of an air bubble in these holes, is thus avoided.

It is particularly advantageous, to bond the connection wires, to deposit silver on the regions of the leadframe which are intended to receive the ends of the connection wires. However, given the fact that the presence of silver contributes to increasing the risk of delamination between the package and the leadframe, the deposition of silver will be advantageously limited to an annular area whose internal boundary 15 lies between the peripheral region 6 and the chip and whose external boundary 16 lies near the boundary of the package 21.

By making flexible regions in the plate of the leadframe by drilling through-passages, it becomes possible, in particular for small packages, to maintain a length d2 of the silvered region 18 of the connection leads which is sufficient to allow, if necessary, two connection wires to be bonded. This length d2 is typically about 0.5 mm.

Figure 5:
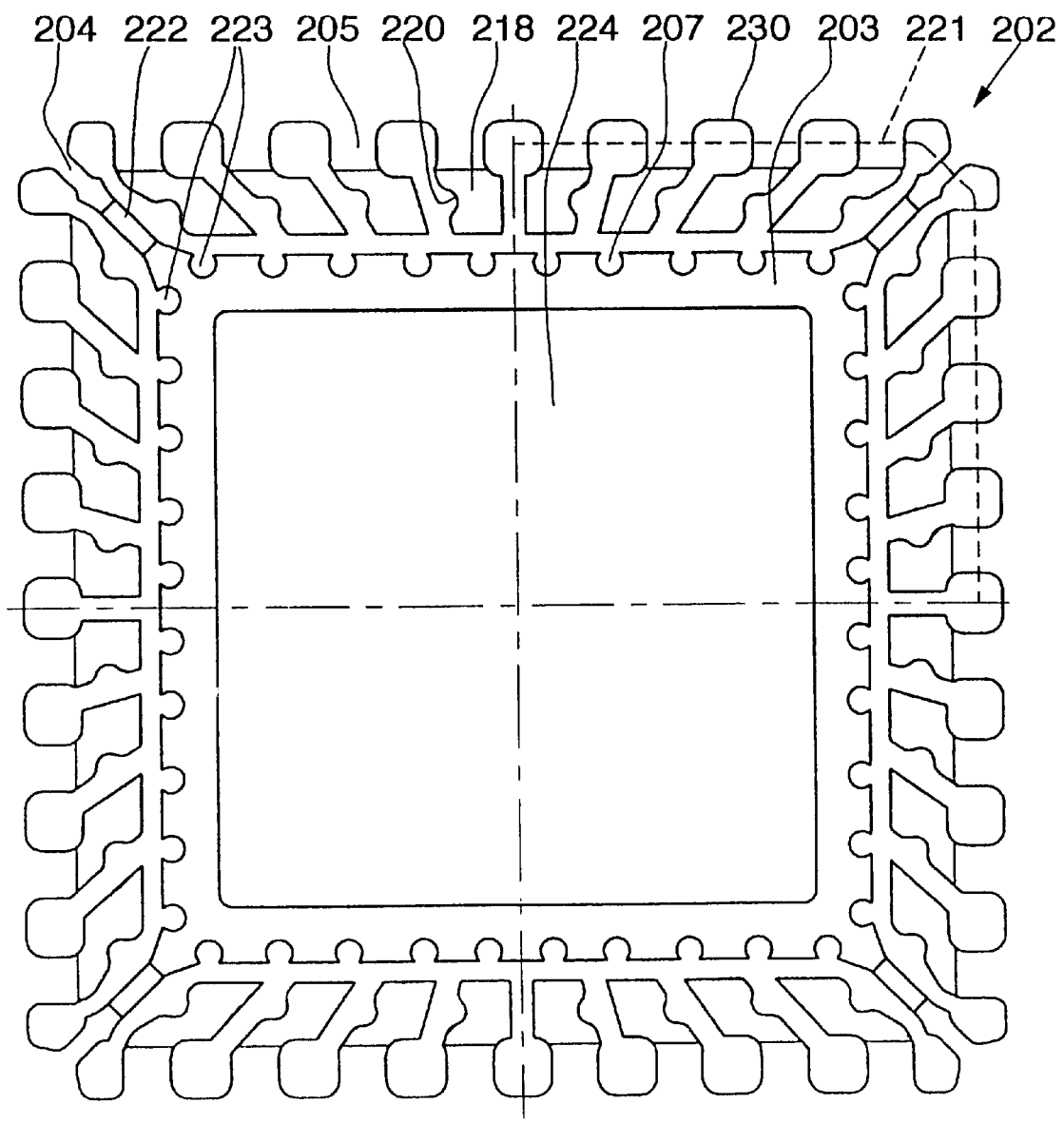
FIG. 5 illustrates, partially, another variant of a leadframe of a device according to the invention.

Provision may also be made for bonding the earth wires to the silvered regions 22 (222, FIG. 5) of the straps 4 (204) of the leadframe. In this case, through-passages 23 lying directly on the strap or else in the immediate vicinity of it (223, FIG. 5) may also be advantageously provided.

Finally, cut-outs 20 made in those parts of the connection leads 5 lying inside the package allow solid encapsulation of the resin and help, in conjunction with the through-passages 7, to minimize the risk of delamination and to keep the leads correctly positioned with respect to each other and with respect to the central plate of the leadframe.

The through-passages made around the periphery of the central plate of the leadframe may either be bounded all around their perimeter, as is the case in the embodiments shown in FIGS. 1 and 2. Alternately, they may emerge laterally around the periphery of the central plate, i.e. they may be partially open laterally, as in the embodiments illustrated in FIGS. 3 to 5.

In these figures, similar components or components having similar functions to those shown in FIGS. 1 and 2 have, respectively, references increased by 100 and by 200 with respect to those which they had in FIGS. 1 and 2. For the sake of simplification, only the differences between these new figures and FIGS. 1 and 2 will now be described.

The fact of providing through-passages 107 or 207, emerging laterally around the periphery of the central plate of the leadframe 103, 203, is particularly advantageous for producing very small packages. For example, such very small packages may be square packages having sides of 7 mm with a square central plate having sides of 5 mm. This is because such an arrangement allows flexible regions to be provided for bonding the earth wires, while maintaining sufficient lengths d1 and d2 in the connection leads 105, 205.

Figure 3:
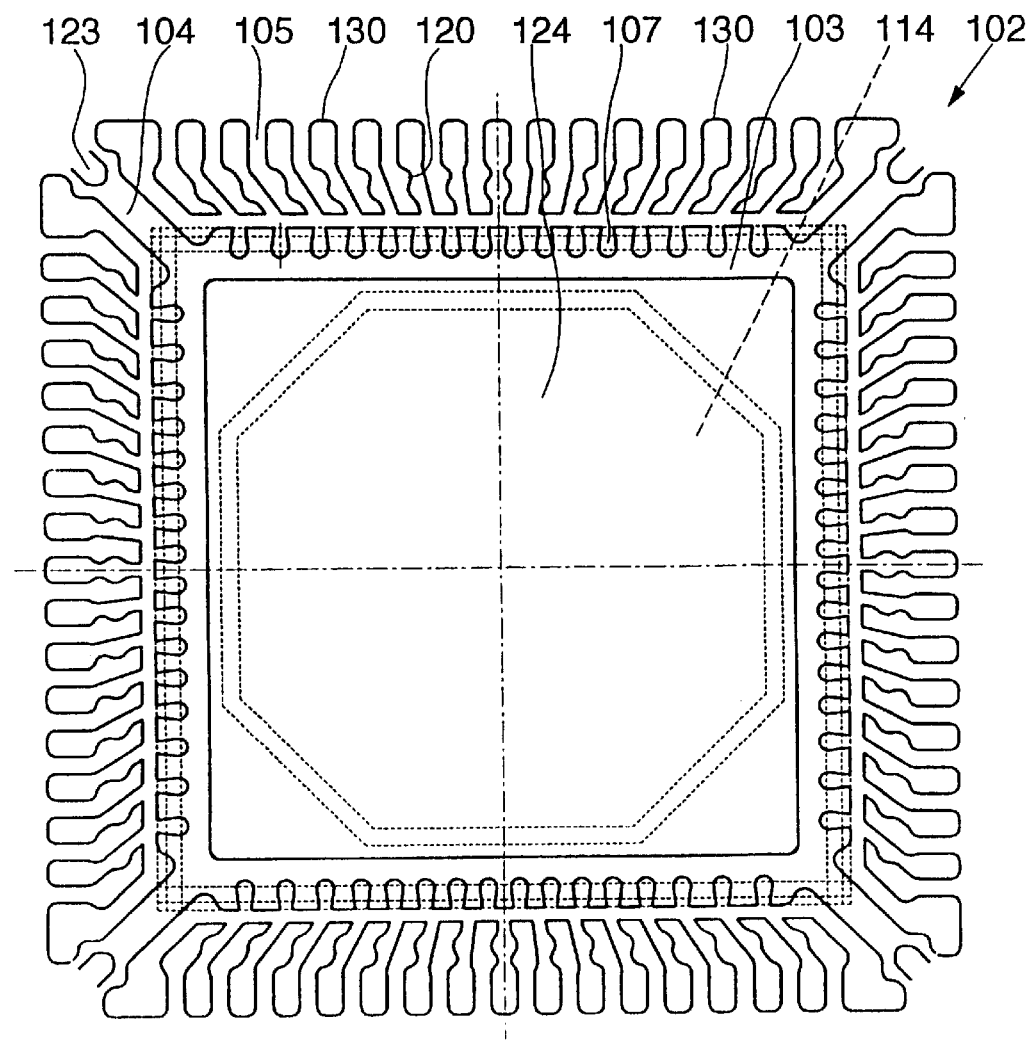
FIGS. 3 and 4 illustrate another variant of a device according to the invention.

When a heat sink is provided, this may be fixed, as in the case shown in FIGS. 1 and 2, under the central plate of the leadframe. However, in particular to ensure better heat dissipation, it is particularly advantageous to fix the chip 101 directly to the upper face of the heat sink 114 (FIGS. 3 and 4). The central plate 103 of the leadframe is then annular, defining on the inside a central orifice 124. The through-passages 107, 207 are provided around the periphery of the annular central plate 103, 203. This annular plate is supported by the upper face of the heat sink 114 and the chip 101 is housed in the central orifice 124 and fixed to the upper face of the heat sink 114. The outer boundary of the heat sink 114 therefore advantageously extends right up to the edge of the annular plate 103 so as to support the regions lying between the through-passages 107, 207. A mechanical bearing surface is thus advantageously produced for these regions, to which the earth wires will optionally be bonded. This is because, in these embodiments having a heat sink directly in contact with the chip, the earth wires are bonded with the heat sink present. In the embodiments shown in FIGS. 1 and 2, i.e. with the solid central plate and the heat sink fixed under the central plate, the earth wires are bonded before the heat sink is put into place and the mechanical bearing surface, during bonding, is obtained directly by the bonding tool.

That which is claimed is:

1. A semiconductor device comprising:

an encapsulating package;

a chip forming an integrated circuit positioned in said encapsulating package; and a leadframe in said encapsulating package and comprising a central plate which houses the chip, a plurality of connection leads placed around the central plate and comprising end portions substantially coplanar with said central plate, and projecting outside said encapsulating package, and internal connection wires at least some of which have an end bonded to said central plate, said central plate having a plurality of through-passages in a peripheral region thereof to increase a flexibility thereof, each of these through-passages lying approximately in an extension of a respective connection lead, and ends of the internal connection wires being bonded to the central plate adjacent at least some respective through-passages.

2. A semiconductor device according to claim 1, wherein ends of at least some of the internal connection wires which are bonded to the central plate lie approximately between at least some of the through-passages.

3. A semiconductor device according to claim 1, wherein the internal connection wires have one of their ends bonded to the central plate have the other end bonded to the chip or to a connection lead; and wherein the internal connection wires include other wires connecting the chip directly to at least some of the connection leads and over-lapping, at least partially, at least some of the through-passages.

4. A semiconductor device according to claim 1, wherein the through-passages are bounded all around their respective perimeters.

5. A semiconductor device according to claim 1, wherein the chip is fixed to a first surface of the central plate of the leadframe; and further comprising a heat sink fixed to a second surface of the central plate opposite the first surface; and wherein the peripheral region containing the through-passages extends along an outer boundary of the heat sink.

6. A semiconductor device according to claim 1, wherein the through-passages emerge laterally around the periphery of the central plate.

7. A semiconductor device according to claim 1, wherein said chip is adhesively bonded to the central plate of the leadframe; and wherein the peripheral region of the central plate containing the through-passages is spaced away from the perimeter of the chip by at least a predetermined distance free of adhesive.

8. A semiconductor device according to claim 7, wherein the central plate of the leadframe comprises a ring and has a central orifice; and wherein an outer boundary of the heat sink extends up to an edge of the ring of the central plate so as to support those regions of the ring which lie between the through-passages.

9. A semiconductor device according to claim 1, wherein the connection leads of the leadframe have cut-outs in portions thereof lying inside said encapsulating package.

10. A semiconductor device according to claim 1, wherein the leadframe includes a peripheral annular deposition of silver covering the peripheral region of the central plate containing the through-passages, and a portion of the connection leads.

11. A semiconductor device according to claim 1, wherein the leadframe includes extensions which extend from corners of the central plate between groups of connection leads; and wherein other through-passages are also provided in the extensions or adjacent thereto so as to allow optional bonding of connection wires adjacent these other through-passages.

12. A semiconductor device comprising:
an encapsulating package;
a chip positioned in said encapsulating package;
a leadframe in said encapsulating package and comprising
a central plate having a first surface to which the chip is fixed,
a plurality of connection leads placed around the central plate and comprising end portions substantially coplanar with said central plate and projecting outside said encapsulating package, and
internal connection wires at least some of which have an end bonded to said central plate,
said central plate having a plurality of through-passages in a peripheral region thereof to increase a flexibility thereof, each of these through-passages lying approximately in an extension of a respective connection lead, and ends of the internal connection wires being bonded to the central plate adjacent at least some respective through-passages; and
a heat sink fixed to a second surface of the central plate opposite the first surface to which the chip is fixed;
the peripheral region containing the through-passages extending along an outer boundary of the heat sink.

13. A semiconductor device according to claim 12, wherein ends of at least some of the internal connection wires which are bonded to the central plate lie approximately between at least some of the through-passages.

14. A semiconductor device according to claim 12, wherein the internal connection wires have one of their ends bonded to the central plate have the other end bonded to the chip or to a connection lead; and wherein the internal connection wires include other wires connecting the chip directly to at least some of the connection leads and over-lapping, at least partially, at least some of the through-passages.

15. A semiconductor device according to claim 12, wherein the through-passages are bounded all around their respective perimeters.

16. A semiconductor device according to claim 12, wherein the through-passages emerge laterally around the periphery of the central plate.

17. A semiconductor device according to claim 12, wherein said chip is adhesively bonded to the central plate of the leadframe; and wherein the peripheral region of the central plate containing the through-passages is spaced away from the perimeter of the chip by at least a predetermined distance free of adhesive.

18. A semiconductor device according to claim 12, wherein the central plate of the leadframe comprises a ring and has a central orifice; and wherein the chip is housed in the central orifice of the central plate and is fixed to the heat sink; and wherein an outer boundary of the heat sink extends up to an edge of the ring of the central plate so as to support those regions of the ring which lie between the through-passages.

19. A semiconductor device according to claim 12, wherein the connection leads of the leadframe have cut-outs in portions thereof lying inside said encapsulating package.

20. A semiconductor device according to claim 12, wherein the leadframe includes a peripheral annular deposition of silver covering the peripheral region of the central plate containing the through-passages, and a portion of the connection leads.

21. A semiconductor device according to claim 12, wherein the leadframe includes extensions which extend from corners of the central plate between groups of connection leads; and wherein other through-passages are also provided in the extensions or adjacent thereto so as to allow optional bonding of connection wires adjacent these other through-passages.

22. A method of connecting internal ground wires of a semiconductor device comprising a leadframe comprising a central plate for housing a chip forming an integrated circuit and a plurality of connection leads placed around the central plate and comprising end portions substantially coplanar with said central plate, the method comprising the steps of:
forming through-passages in a peripheral region of the central plate to increase a flexibility thereof, each of these through-passages lying approximately in the extension of a connection lead of the leadframe; and
bonding one end of the ground wires adjacent at least some of the through-passages.

23. A method according to claim 22, further comprising the step of bonding the ends of at least some of the ground wires approximately between at least some of the through-passages.

24. A method according to claim 22, wherein the step of forming the through-passages comprises forming same to be bounded all around their respective perimeters.

25. A method according to claim 22, wherein the step of forming the through-passages comprises forming same to emerge laterally around the periphery of the central plate.

26. A method according to claim 22, wherein the leadframe comprises extensions which extend from corners of the central plate between groups of connection leads; and further comprising the step of forming other through-passages in the extensions or adjacent same so as to allow optional bonding of ground wires adjacent these other through-passages.

27. A method according to claim 22, further comprising the step of fixing a heat sink to the chip and the leadframe.

* * * * *